US010269824B2

(12) United States Patent
Kim et al.

(10) Patent No.: US 10,269,824 B2
(45) Date of Patent: Apr. 23, 2019

(54) NON-VOLATILE MEMORY STRUCTURES HAVING MULTI-LAYER CONDUCTIVE CHANNELS

(71) Applicant: Intel Corporation, Santa Clara, CA (US)

(72) Inventors: Changhan Kim, Boise, ID (US); Scott M. Pook, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/477,051

(22) Filed: Apr. 1, 2017

(65) Prior Publication Data

US 2018/0286874 A1    Oct. 4, 2018

(51) Int. Cl.
| | |
|---|---|
| *H01L 27/1157* | (2017.01) |
| *H01L 27/11582* | (2017.01) |
| *H01L 21/02* | (2006.01) |
| *G11C 16/10* | (2006.01) |
| *G11C 16/04* | (2006.01) |

(52) U.S. Cl.
CPC ...... *H01L 27/1157* (2013.01); *G11C 16/0483* (2013.01); *G11C 16/10* (2013.01); *H01L 21/02587* (2013.01); *H01L 27/11582* (2013.01)

(58) Field of Classification Search
CPC ............... H01L 27/1157; H01L 29/685; H01L 27/11543; H01L 27/11556; H01L 27/11582; H01L 21/02587; H01L 27/11578; G11C 16/0483; G11C 16/10

See application file for complete search history.

(56) References Cited

U.S. PATENT DOCUMENTS

| | | | | |
|---|---|---|---|---|
| 9,520,409 | B2 * | 12/2016 | Kim | H01L 27/11578 |
| 9,818,757 | B2 * | 11/2017 | Ikeda | H01L 27/11582 |
| 2010/0109065 | A1 | 5/2010 | Oh et al. | |
| 2015/0131381 | A1 * | 5/2015 | Rhie | G11C 16/14 365/185.17 |
| 2017/0077230 | A1 * | 3/2017 | Ikeda | H01L 27/11582 |
| 2017/0263623 | A1 * | 9/2017 | Zhang | H01L 29/167 |

* cited by examiner

*Primary Examiner* — David Lam
(74) *Attorney, Agent, or Firm* — Thorpe North & Western, LLP; David W. Osborne

(57) ABSTRACT

Conductive channel technology is disclosed. In one example, a memory component can include a source line, a conductive channel having first and second conductive layers electrically coupled to the source line and memory cells adjacent to the conductive channel. In one aspect, channel conductivity and reliability is improved over a single layer conductive channel formation scheme by preventing unwanted oxide formation, increasing the interface contact area, and by modulating material grain size and boundaries via multiple thin channel integration scheme. Associated systems and methods are also disclosed.

18 Claims, 7 Drawing Sheets

NON-VOLATILE MEMORY STRUCTURES HAVING MULTI-LAYER CONDUCTIVE CHANNELS

TECHNICAL FIELD

Embodiments described herein relate generally to semiconductor electronic circuitry, and more particularly to conductive channels and source line coupling.

BACKGROUND

Semiconductor materials (e.g., polysilicon) are used to form electrical conduits, or channels in a variety of electronic devices, for example, devices that employ complimentary metal-oxide-semiconductor (CMOS) materials. CMOS technology is used in numerous electronic devices and components, including microprocessors, microcontrollers, computer memory, and digital logic circuits.

Various computer memory types, such as static random access memory (SRAM) and flash memory (e.g., NOR, NAND, and charge trap), utilize CMOS materials and have architecture that electrically couples a source line to an array of memory cells. Typically, memory cells in flash memory arrays are arranged such that a control gate of each memory cell in a row of the array is connected to form an access line, such as a word line. Columns of the array include strings of memory cells connected source to drain, between a pair of select lines, a source select line and a drain select line.

Flash memory arrays may be in two-dimensional configurations or three-dimensional (3D) configurations (e.g., stacked memory arrays including pillars of stacked memory elements, such as vertical NAND strings). The source select line includes a source select gate at each intersection between a memory cell string and the source select line, and the drain select line includes a drain select gate at each intersection between a memory cell string and the drain select line. Each source select gate is connected to a source line, while each drain select gate is connected to a data line, such as a column bit line. Typically, the source line and the data line are formed of polysilicon and the memory cells are connected via a polysilicon channel, which is electrically coupled to the source and data lines.

BRIEF DESCRIPTION OF THE DRAWINGS

Invention features and advantages will be apparent from the detailed description which follows, taken in conjunction with the accompanying drawings, which together illustrate, by way of example, various invention embodiments; and, wherein.

Figure 1:
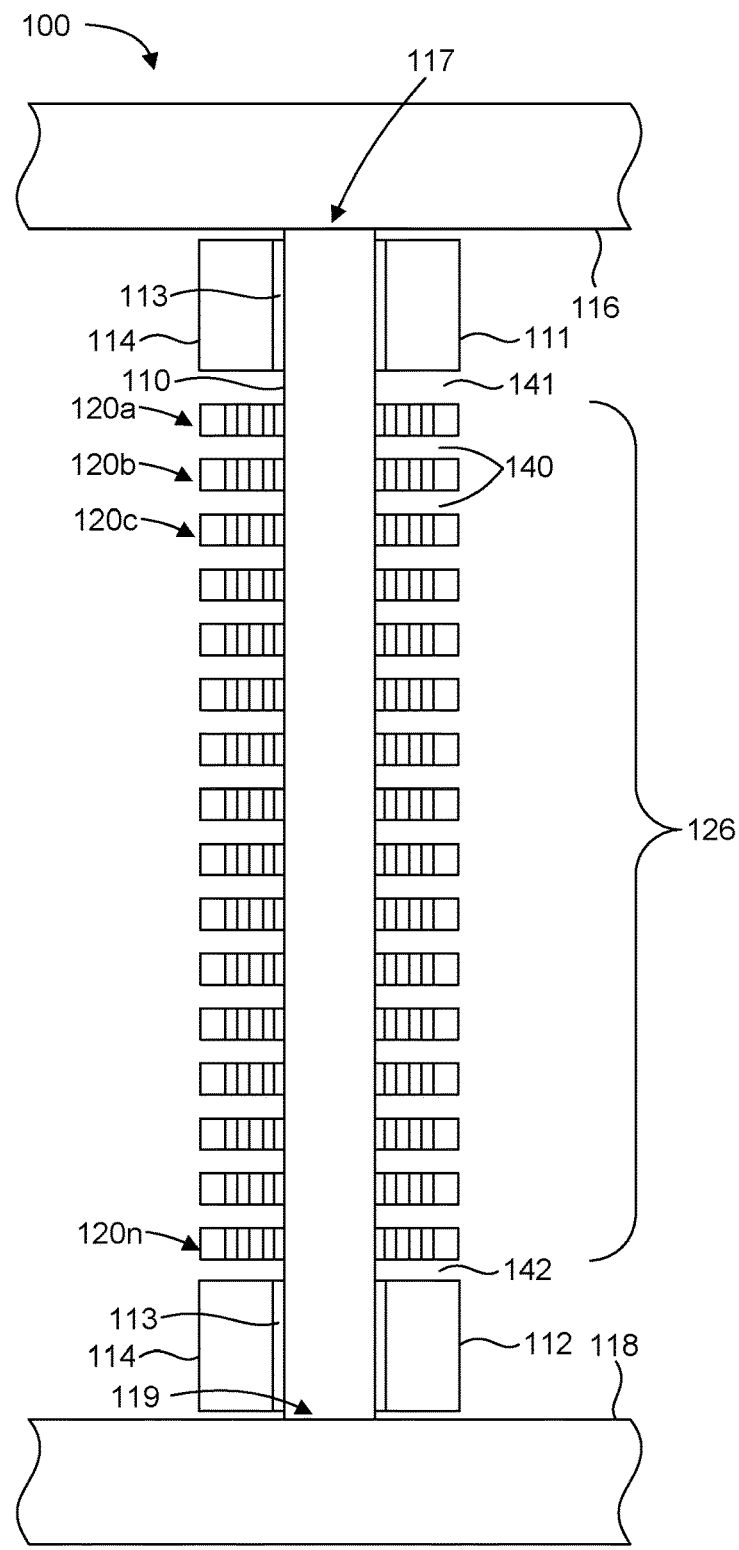
FIG. 1 illustrates a portion of a 3D NAND memory component in accordance with an example.

Reference will now be made to the exemplary embodiments illustrated, and specific language will be used herein to describe the same. It will nevertheless be understood that no limitation of the disclosure scope or to specific invention embodiments is thereby intended.

DESCRIPTION OF EMBODIMENTS

Before invention embodiments are disclosed and described, it is to be understood that no limitation to the particular structures, process steps, or materials disclosed herein is intended, but also includes equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence. Unless defined otherwise, all technical and scientific terms used herein have the same meaning as commonly understood by one of ordinary skill in the art to which this disclosure belongs.

As used in this written description, the singular forms "a," "an" and "the" include express support for plural referents unless the context clearly dictates otherwise. Thus, for example, reference to "a layer" includes a plurality of such layers.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open ended term in the written description, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

The term "coupled," as used herein, is defined as directly or indirectly connected in an electrical or nonelectrical manner. "Directly coupled" structures or elements are in physical contact with one another. Objects described herein as being "adjacent to" each other may be in physical contact with each other, in close proximity to each other, or in the same general region or area as each other, as appropriate for the context in which the phrase is used.

As used herein, comparative terms such as "increased," "decreased," "better," "worse," "higher," "lower," "enhanced," "maximized," and "minimized," and the like refer to a property of a device, component, or activity that is measurably different from other comparable devices, components, or activities, or from different iterations or embodiments of the same device, properties in the known state of the art. For example, a data region that has an "increased" risk of corruption can refer to a region of a memory device, which is more likely to have write errors to it than other regions in the same memory device. A number of factors can cause such increased risk, including location, fabrication process, number of program pulses applied to the region, etc.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, sizes, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment. Occurrences of the phrase "in one embodiment," or "in one aspect," herein do not necessarily all refer to the same embodiment or aspect.

Furthermore, the described features, structures, or characteristics may be combined in any suitable manner in one or more embodiments. In this description, numerous specific details are provided, such as examples of layouts, distances, network examples, etc. One skilled in the relevant art will recognize, however, that many variations are possible without one or more of the specific details, or with other methods, components, layouts, measurements, etc. In other instances, well-known structures, materials, or operations are not shown or described in detail but are considered well within the scope of the disclosure.

Example Embodiments

An initial overview of technology embodiments is provided below and specific technology embodiments are then described in further detail. This initial summary is intended to aid readers in understanding the technology more quickly, but is not intended to identify key or essential features of the technology nor is it intended to limit the scope of the claimed subject matter. Furthermore, while flash memory, in particular NAND and 3D NAND memory devices are utilized and exemplified herein to describe various invention concepts and embodiments, it should be understood that general technology aspects and invention principles shown are equally applicable to other electronic devices with similar components, features, materials, or operation (e.g. CMOS devices with conductive channels electrically coupling components to a source line).

A typical electrical coupling (i.e., a conductive channel) between a string of flash memory cells and an electrical source line has oxide material at the interface, which causes resistance that undesirably degrades current (e.g., string current) and reliability. This oxide material results from damage done to the source line during processing to establish the electrical coupling. In addition, an electrical interface between the conductive channel and the source line created by typical methods is relatively small, thus limiting the current carrying capacity of the interface. Furthermore, increasing the conductive channel thickness also increases the grain size of the channel material, which degrades performance. Typical conductive channels are limited in thickness by grain size and boundary constraints in order to meet performance metrics, and are therefore limited in current carrying capacity. Accordingly, memory components are disclosed that provide improved conductive channel performance and reliability by addressing the electrical interface with the source line and the structure of the conductive channel.

One exemplary mechanism by which conductive channel performance can be improved is by improving the current carrying capacity and/or characteristics of the conductive channel. In one aspect, unwanted oxide formation at the interface between the conductive channel and the source line due to damage to the source line can be minimized or eliminated to provide performance and reliability benefits. In one example, a memory component can include a source line, a conductive channel having first and second conductive layers electrically coupled to the source line, and memory cells adjacent to the conductive channel. Associated systems and methods are also disclosed.

Referring to FIG. 1, a portion of a 3D NAND memory component 100 is illustrated schematically. In general, the portion of the memory component includes a pillar (i.e., conductive or semi-conductive channel) 110 and memory cells 120a-n (i.e., a string 126 of memory cells) located adjacent to the conductive channel 110. Any suitable number of memory cells can be included. The conductive channel 110 can be made of any suitable material (e.g., polysilicon) such that the conductive channel can act as a channel region for the memory cells 120a-n, which can be coupled in series. For example, during operation of one or more of the memory cells 120a-n of the string, a channel can be formed in the (semi) conductive channel 110. The conductive channel 110 and the string of memory cells 120a-n can be oriented vertically, such as in a three-dimensional memory array. For example, memory cell 120a is located at a vertical level (e.g., near the top of the memory array) that is above a vertical level (e.g., near the bottom of the memory array) at which memory cell 120n is located. Typically, the conductive channel 110 will have a generally cylindrical configuration and the structures of each memory cell 120a-n will be disposed in concentric ring-like structures radially outward from the conductive channel. The memory cells 120a-n can have any suitable structure. A memory cell structure is provided for context and by way of an example. Therefore, it should be recognized that suitable memory cell structures can vary from the memory cell structure disclosed herein.

Figure 2A:
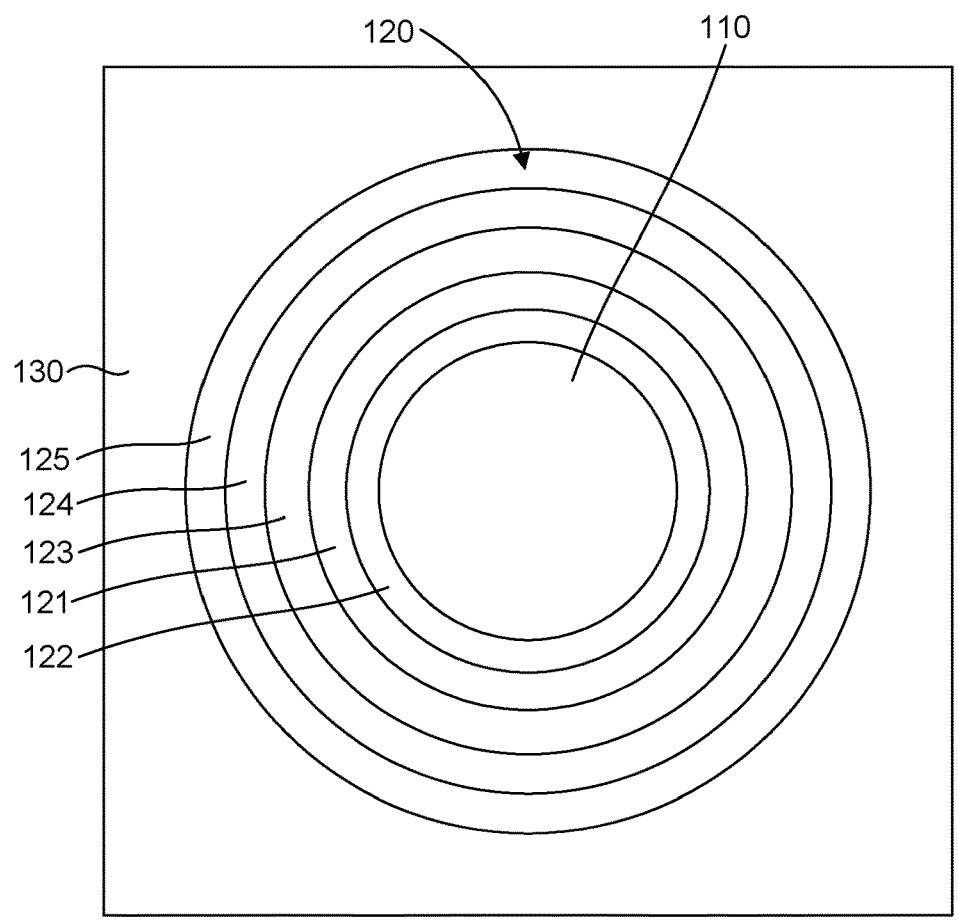
FIG. 2A illustrates a top view of a memory pillar and a memory cell of the 3D NAND memory component of FIG. 1.
Figure 2B:
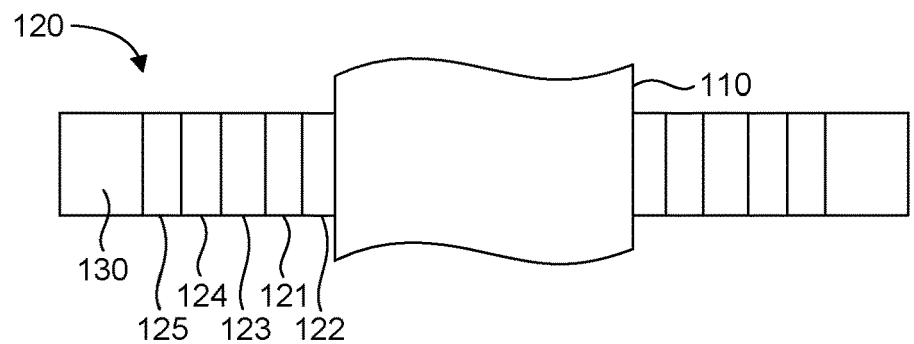
FIG. 2B illustrates a side view of a memory pillar and a memory cell of the 3D NAND memory component of FIG. 1.

Each memory cell 120a-n in this example can have a charge-storage structure (e.g., that can be a conductive floating gate, for example a floating gate metal-oxide-semiconductor transistor (FGMOSFET), a dielectric charge trap, etc.). For example, as shown in FIGS. 2A and 2B, which illustrates top and side views, respectively, of the conductive channel 110 and a representative memory cell 120, the memory cell 120 can have a charge-storage structure 121. Each memory cell 120a-n can also have a tunnel dielectric interposed between its charge-storage structure and the conductive channel 110. For example, the memory cell 120 can have a tunnel dielectric 122 interposed between the charge-storage structure 121 and the conductive channel 110. In addition, each memory cell 120a-n can have a control gate (e.g., as a portion of, or coupled to, access lines, such as word lines). For example, the memory cell 120 can include a control gate 130. Each memory cell can have one or more dielectric materials or dielectric layers interposed between its charge-storage structure and the control gate. For example, the memory cell 120 can include dielectric layers (e.g., inter-poly dielectric (IPD) layers) 123-125 interposed between the charge-storage structure 121 and the control gate 130.

Each memory cell 120 may have a charge-storage structure 121, such as a floating gate that can be a conductor (e.g., polysilicon), a charge trap that can be a dielectric, etc. Non-limiting examples of conductive or semi-conductive material that are suitable for a floating gate include polysilicon, silicated or non-silicated metal such as Ru, Pt, Ge, etc. with metals being either continuous or discontinuous. Non-limiting examples of dielectrics that are suitable for charge traps include nitrides, a silicon rich dielectric, or SiON/Si$_3$N$_4$.

With further reference to FIG. 1, a dielectric 140 can be interposed between successively adjacent memory cells 120a-n in the string 126. For example, a dielectric 140 may be interposed between at least the floating gates 121, the dielectrics 123-125 and the control gates 130 of successively adjacent memory cells 120a-n. A dielectric 141 may be interposed between an end (e.g., between memory cell 120a) of the string 126 and the select gate 111, and a dielectric 142 may be interposed between an opposite end (e.g., between memory cell 120n) of the string 126 and the select gate 112, as shown in FIG. 1.

In some embodiments, where the charge-storage structure 121 is a charge trap, the tunnel dielectric 122, the charge-storage structure 121, and the dielectrics 123-125 can form a continuous structure that can be shared by (e.g., that may be common to) two or more of the memory cells 120a-n. For example, such a structure can be shared by or common to all of the memory cells 120a-n. A tunnel dielectric for a charge trap-based device can be of multiple layers (e.g., oxide/nitride/oxide (O/N/O)) instead of a single dielectric layer, which is typical of floating gate tunnel dielectrics.

In some embodiments, the string 126 can be interposed between and coupled in series to "dummy" memory cells (not shown) to form a string of memory cells that includes the string 126 and "dummy" memory cells. For example, one or more "dummy" memory cells can be interposed between and coupled in series with the memory cell 120a of the string 126 and the select gate 111, and/or one or more "dummy" memory cells can be interposed between and coupled in series with the memory cell 120n of the string 126 and the select gate 112. Each "dummy" memory cell can be configured in a manner similar to, and may have the same components as, the memory cells 120a-n. In some embodiments, a group of dummy memory cells can replace select gates, or can be added to dummy memory cells.

Each memory cell 120a-n of the string 126 can be coupled (e.g., in series with), and can be between, a select gate (e.g., a drain select gate) 111 adjacent to the conductive channel 110 and a select gate (e.g., a source select gate) 112 adjacent to (e.g., in contact with) the conductive channel 110. The conductive channel 110 is electrically coupled to a data line (e.g., a bit line 116), indicated at 117. Thus, the select gate 111 can selectively couple the string 126 to the data line (e.g., the bit line 116). In addition, the conductive channel 110 is electrically coupled to a source line 118, indicated at 119. Thus, the select gate 112 can selectively couple the string 126 to the source line 118. For example, the select gate 111 can be coupled in series with memory cell 120a, and the select gate 112 can be coupled in series with memory cell 120n. The select gates 111 and 112 can each include a gate dielectric 113 adjacent to conductive channel 110 and a control gate 114 adjacent to a corresponding gate dielectric 113.

Figure 3:
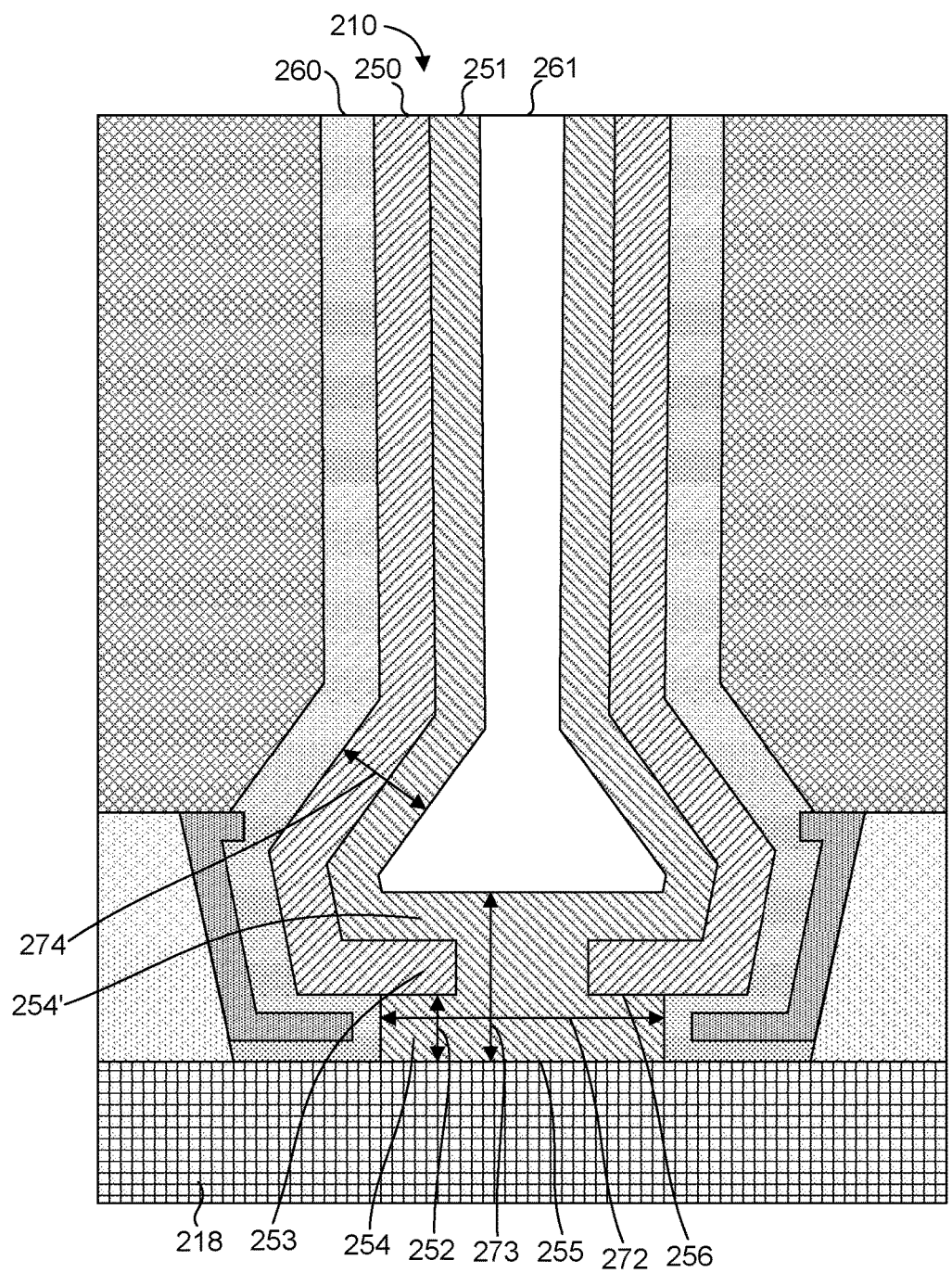
FIG. 3 is a detail view of a conductive channel electrically coupled to a source line in accordance with an example.

FIG. 1 represents the various components and structures of a memory component 100 schematically and therefore lacks some detail with regard to the conductive channel 110 and the electrical coupling between the conductive channel 110 and the source line 118. Additional detail is provided in FIG. 3, which illustrates a detail view of a conductive channel 210 electrically coupled to a source line 218 (similar to 119 in FIG. 1), in accordance with an example of the present disclosure. As shown in FIG. 3, the conductive channel 210 can have multiple conductive layers 250, 251 electrically coupled to the source line 218. The source line 218 can comprise any suitable conductive material, such as a doped polysilicon material. The conductive layers 250, 251 can be configured with the same or different materials, as discussed in more detail below.

At least one of the conductive layers 250, 251 can be in direct contact (e.g., interfacing electrical contact) with the source line 218. As illustrated, the conductive layer 250 can be physically separated or spaced apart (as illustrated by the arrow 252) from the source line 218 and not in direct contact or interfacing with the source line 218. A portion 254 of the conductive layer 251, however, can be disposed between the source line 218 and the conductive layer 250. With the conductive layer 251 disposed in the space 252 between the conductive layer 250 and the source line 218. a portion 253 of the conductive layer 250 can be between (i.e., "sandwiched" or surrounded by) the portions 254, 254' of the conductive layer 251. In other words, the portion 254' of the conductive layer 251 can be disposed over the portion 253 of the conductive layer 250, and the portion 254 of the conductive layer 251 can be disposed under the portion 253 of the conductive layer 250. The portion 254 of the conductive layer 251 between source line 218 and the conductive layer 250 can directly contact (i.e., be in direct physical contact) or interface with the source line 218 at 255 and with the conductive layer 250 at 256. The interface 255 of the conductive layer 251 and the source line 218 can be planar or flat (e.g., devoid of surface irregularities such as pits, recesses, bumps, etc. that may result from certain etching processes).

As further shown in FIG. 3, a dielectric layer 260 can be adjacent to the conductive channel 210. The dielectric layer 260 can form a tunnel dielectric for memory cells adjacent to the channel 210 and/or a gate dielectric for a select gate. The dielectric layer 260 can comprise any suitable dielectric material, such as an oxide material (e.g., silicon oxide). In addition, an insulative material 261 can be disposed within the conductive channel 210 (e.g., filling a space or void in an interior of the conductive channel 210). The insulative material 261 can be any suitable insulative material, such as silicon oxide.

As mentioned above, the conductive layers 250, 251 can be configured with the same or different materials. Thus, the conductive layers 250, 251 can be configured individually to achieve desired performance objectives. In some embodiments, the conductive layers 250, 251 can each comprise a polysilicon material, which may be undoped, similarly or same doped, or doped different from one another as to dopant type and/or dopant concentration. For example, one conductive layer can be doped while another conductive layer is undoped, all conductive layers can be doped with the same N-type or P-type doping, or one conductive layer can be doped with N-type doping while another conductive layer is doped with P-type doping. A similar example can apply to dopant concentration. In one aspect, selecting different doping combinations can be configured to induce controllability of which conductive layer will channel (i.e., flow or conduct) electrons by confining charge carrier depth and position via electrostatic potential barrier as in a P-type and N-type junction. This may contribute to current (e.g., string current) improvement by channel interface scattering reduction and by balancing grain size and grain boundary, which may also lead to reliability improvement. Ge or SiGe may also be suitable materials for a conductive layer of the conductive channel 210.

Although two conductive layers are illustrated in the conductive channel 210, it should be recognized that the channel 210 can include any suitable number of conductive layers. For example, a conductive channel can have three conductive layers where the layers are arranged with alternating dopant types (e.g., P-N-P or N-P-N), which may serve to provide a P-N junction effect to control the charge carrier flow through the conductive layers with respect to depth and position (e.g., at the tunnel oxide, toward the tunnel oxide, or away from tunnel oxide) in the way that it minimizes interface scattering. The number of conductive layers can be expanded as desired for electron carrier confinement. Thus, as disclosed herein, the conductive channel 210 can be configured to function as a multi-channel (e.g., dual or triple channel) by varying the number of conductive layers.

In one aspect, the conductive layers 250, 251 of the conductive channel 210 can provide control of individual conductive layer amorphous/crystalline material phase (e.g., of polysilicon grain), which may be configured to provide desired attributes such as maximizing string current by its material bulk property change and minimizing interface scattering at adjacent layers. Material (e.g., polysilicon) grain size can be individually controlled for the conductive layers 250, 251 of the conductive channel 210. A thicker conductive channel is desirable to provide higher current (e.g., string current), in accordance with embodiments. However, thicker material is detrimental to performance (e.g., program $V_t$ sigma (PVS) and subthreshold swing (SS) degradation) in a single, thick layer due to the larger grain size that occurs during formation of the channel, which limits channel thickening. PVS is an electrical metric for programming speed variation, which is attributed to multiple factors such as cell doping type/concentration, charge tunneling, their structural configuration, etc. SS is a measure of transistor ON/OFF switching performance based on an exponential behavior of drain current as a function of gate voltage. With multiple conductive layers 250, 251, the grain size can be maintained within acceptable limits while effectively thickening the conductive channel 210 to provide higher current without degradation for a given thickness. This benefit can be multiplied by the number of conductive layers in a conductive channel.

Thus, material type, dopant concentrations, dopant combinations, and/or material grain size/structure can be controlled in the channel 210 to provide performance benefits. The conductive channel can include any suitable number of conductive layers having any suitable material characteristic or attribute in any combination.

In one aspect, the interface 255 between the source line 218 and the conductive layer 251 can have a relatively large diameter 272, which can improve electrical contact area and reduce resistance. In one example, the diameter 272 can be greater than or equal to 25 nm.

Figure 4A:
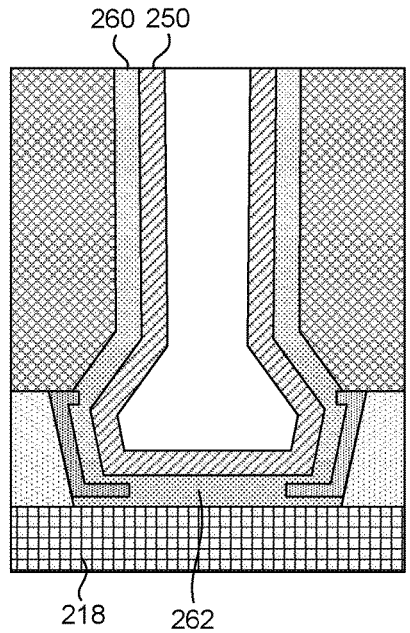
FIGS. 4A-4D illustrate methods for making a flash memory component in accordance with an example.

FIGS. 4A-4D illustrate aspects of exemplary methods or processes for making a conductive channel as disclosed herein. In particular, the figures show the electrical coupling of a channel to a source line and the formation of a channel with multiple layers, such as is illustrated in FIG. 3. FIG. 4A illustrates the conductive layer 250 formed on the dielectric layer 260. The dielectric layer 260 can have a bottom portion 262 proximate the source line 218. The conductive layer 250 can be formed on the dielectric layer 260 by any suitable technique or process, such as a deposition process. As shown in FIG. 3, the conductive layer 250 in its final form will be part of the conductive channel 210 and the dielectric layer 260 in its final form will serve as a tunnel and/or gate dielectric. Thus, the conductive layer 250 is not used as a sacrificial layer but is, instead, used along with the subsequently deposited conductive layer 251 to form the conductive channel 210. By maintaining the conductive layer 250 on the dielectric layer 260 throughout the disclosed manufacturing process, the dielectric layer 260 can be protected and therefore avoid exposure to harmful etching chemicals that may cause detrimental surface property modification that degrades performance and reliability of the tunnel and/or gate dielectric. In other words, the tunnel and/or gate dielectric can maintain its as-deposited quality (only being exposed to the deposition of the conductive layer 250), and therefore remaining intact and undamaged by subsequent processing.

Figure 4B:
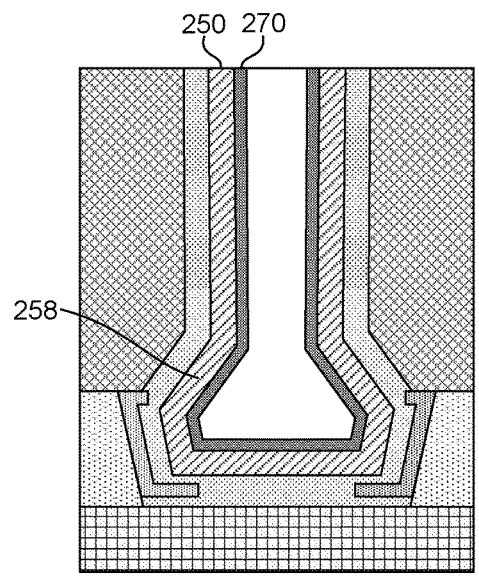
Figure 4C:
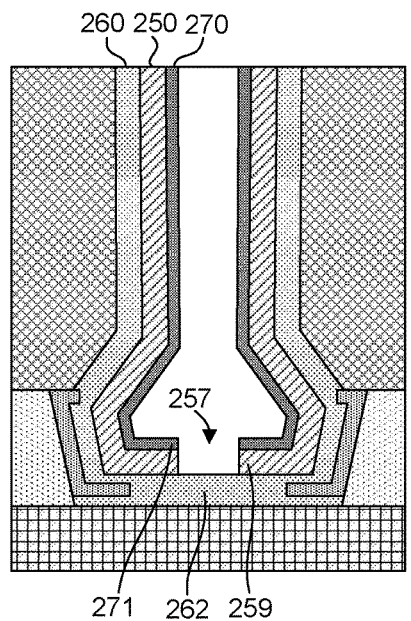
Figure 4D:
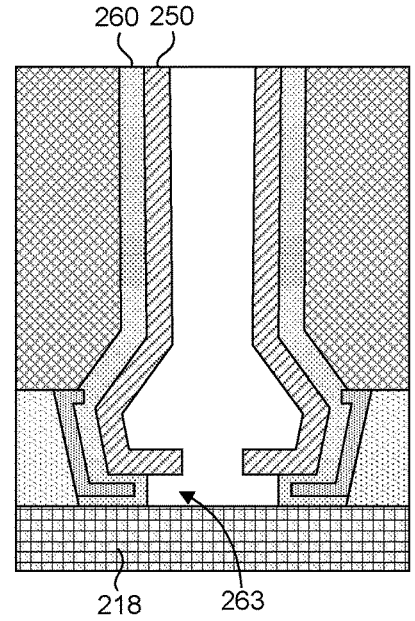

FIGS. 4B-4D show how the source line 218 can be exposed through the bottom portion 262 of the dielectric layer 260 to facilitate electrically coupling the channel 250 to the source line 218 as shown in FIG. 3. In one aspect, the source line 218 can be exposed by forming an opening 257 in the conductive layer 250 (see FIG. 4C). In some embodiments, the opening 257 can be formed by etching, which may expose the material of the conductive layer 250 to unwanted damage. FIG. 4B illustrates a process that may protect an upper portion 258 of the conductive layer 250 from etching while making the opening 257 through the conductive layer 250. For example, the upper portion 258 of the conductive layer 250 can be protected by forming a sacrificial layer 270 on the conductive layer 250. The sacrificial layer 270 can comprise any suitable material, such as an oxide material (e.g., silicon oxide) a nitride material (e.g., SiN), etc. The sacrificial layer 270 can be formed on the conductive layer 250 by any suitable technique or process, such as a deposition or growth process.

With the upper portion 258 of the conductive layer 250 protected by the sacrificial layer 270, the opening 257 can be formed through a bottom portion 271 of the sacrificial layer 270 and through a bottom portion 259 of the conductive layer 250 to expose the bottom portion 262 of the dielectric layer 260, as shown in FIG. 4C. The opening 257 can be formed through the bottom portion 271 of the sacrificial layer 270 and through the bottom portion 259 of the conductive layer 250 by any suitable technique or process, such as etching (e.g., dry and/or wet etching), as mentioned above. In one embodiment, the opening 257 can be formed by a dry punch etch through the sacrificial layer 270 and the conductive layer 250 toward the conductive layer 251, which selectively stops at the dielectric layer 260 that is over (i.e., covering) the source line 218. Thus, the bottom portion 262 of the dielectric layer 260 can protect the source line 218 from the dry etch.

The bottom portion 262 of the dielectric layer 260 proximate the opening 257 can then be removed to expose the source line 218, as shown in FIG. 4D. Exposing the source line 218 can form a recess 263 between the conductive layer 250 and the source line 218. The recess 263 can provide a large exposure on the source line 218 for the contact interface 255 with the dielectric layer 251 (see FIG. 3), thus improving electrical contact area and reducing resistance. In one aspect, the sacrificial layer 270 can be removed from the conductive layer 250 in the same process that exposes the source line 218 and forms the recess 263. The bottom portion 262 of the dielectric layer 260 and the sacrificial layer 270 can be removed by any suitable technique or process, such as etching (e.g., dry and/or wet etching). In one embodiment, the bottom portion 262 of the dielectric layer 260 and the sacrificial layer 270 can be removed by a wet etch process, such as hydrofluoric acid (HF) (e.g., for silicon oxide), hot HF, buffered oxide edge (BOE) (e.g., for silicon oxide), hot phosphorous (e.g., if SiN sacrificial layer is used), etc. Thus, a relatively small opening 257 resulting from a dry etch, which is due to the existence of the sacrificial layer 270, can be effectively enlarged by the wet etch that forms the recess 263 for greater exposure of the source line 218. In one aspect, the etch process can be selected and configured such that the source line 218 remains undamaged, thus leaving the exposed portion (i.e., surface) of the source line 218 undamaged (e.g., planar or flat without surface irregularities such as pits, recesses, bumps, etc. that can be caused by etching). This prevents oxide formation at the interface 255 between the source line 218 and the conductive layer 251 (see FIG. 3) that cannot be removed, which can avoid the electrical resistance caused by such oxide and associated reductions in current. Thus, a hybrid dry and wet etch process can be utilized as discussed with respect to FIGS. 4C and 4D to expose the source line 218 through the conductive layer 250 and the dielectric layer 260. In some embodiments, a dry etch step can be replaced with any other type of etch that has a directionality during etch.

With the source line 218 exposed, the conductive layer 251 can be formed on the conductive layer 250 such that the conductive layers 250, 251 are electrically coupled to the source line 218 (e.g., via the interfaces 255 and 256) to achieve the final configuration as shown in FIG. 3. This can include forming the conductive layer 251 in the recess 263 such that the conductive layer 251 interfaces with the source line 218 and the conductive layer 250. The recess 263, which can be formed by the hybrid dry and wet etch process, can enable the portions 254, 254' of the conductive layer 251 to sandwich or surround the portion 253 of the conductive layer 250. The conductive layer 251 can therefore electrically connect the conductive layer 250, which is physically separated from the source line 218, to the source line 218. The conductive layer 251 can be formed on the conductive layer 250 by any suitable technique or process, such as a deposition process and/or epitaxial growth process. In one aspect, a bottom thickness 273 of the conductive layer 251 can be thicker than a sidewall thickness 274 of the conductive channel 210. The exposed surface of the source line 218 for the interface 255 may facilitate formation of very thick conductive layer 251 material deposition at the bottom of the conductive channel 210, which resembles, and may be due to, a sort of epitaxial growth that may result from the surface conditioning or modification of the source line 218 material from the etching process, thus providing a very clean and uniform reactive bonding site rearrangement. Following formation of the final conductive layer (e.g., the conductive layer 251), if the conductive channel is hollow, then the conductive channel can optionally be filled with a suitable insulative material, such as silicon oxide.

Although the structures and methods of FIGS. 3-4D are described above in the context of an electrical coupling between a conductive channel and a source line, it should be recognized that these structures and methods have application elsewhere, such as in electrically coupling multiple vertically stacked "decks" of memory strings (e.g., coupling one pillar or conductive channel to another). Such multiple stacked decks may utilize a "plug" formation (e.g., conductive material such as polysilicon) between the decks. The present technology can facilitate forming and electrically coupling the conductive channels of the decks to the plugs with little or no damage to the plugs.

Referring again to FIG. 1, the formation of the conductive channel 110 and coupling of the channel 110 to the source line 118 will typically occur after formation of the memory cells 120a-n. The memory cells can be formed by any suitable method. For example, a pillar opening can be formed by etching through multiple alternating layers or tiers of conductive and dielectric materials. Conductive layers can include any suitable conductive material, such as polysilicon, which can be conductively doped (e.g., to an N+ type conductivity). Dielectric layers can include any suitable dielectric material, such as an oxide (e.g., silicon oxide), an oxynitride (e.g., silicon oxynitride), etc. To form memory cells adjacent to a conductive channel a series of processes, including etching and deposition processes, can be executed using the pillar opening for access to memory cell locations. Memory cell structures that can be formed include charge storage structures (e.g., floating gates), control gates, tunnel dielectrics, blocking dielectrics, etc.

Figure 5:
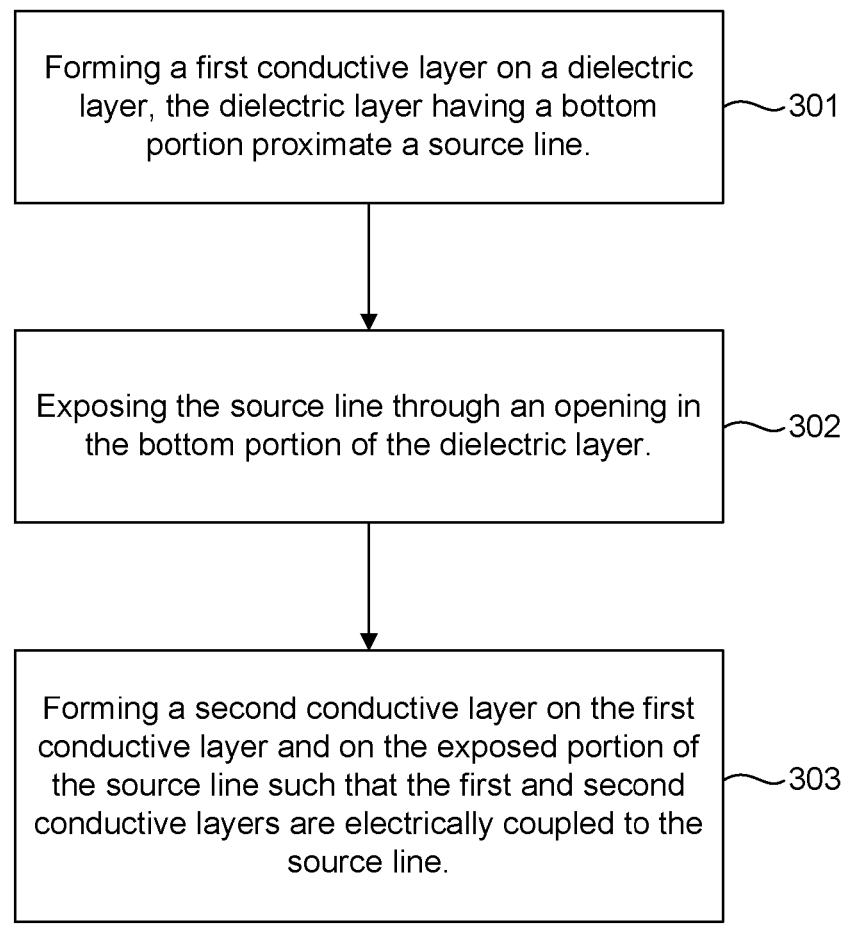
FIG. 5 is a flow diagram of methods for making a flash memory component in accordance with an example.

Methods or processes for making a flash memory component or cell are summarized in a flow diagram in FIG. 5. A first conductive layer can be formed on a dielectric layer, the dielectric layer having a bottom portion proximate a source line, as shown in block 301. The source line can be exposed through an opening in the bottom portion of the dielectric layer, as shown in block 302. A second conductive layer can be formed on the first conductive layer and on the exposed portion of the source line such that the first and second conductive layers are electrically coupled to the source line, as shown in block 303.

Once again, although the present disclosure is provided primarily in the context of a 3D NAND flash memory device, it should be understood that certain aspects of the technology may also be applicable to any device that utilizes semiconductor material (e.g., polysilicon) to form electrical channels or conduits. In particular, the technology may be applicable to many devices that include CMOS components.

Figure 6:
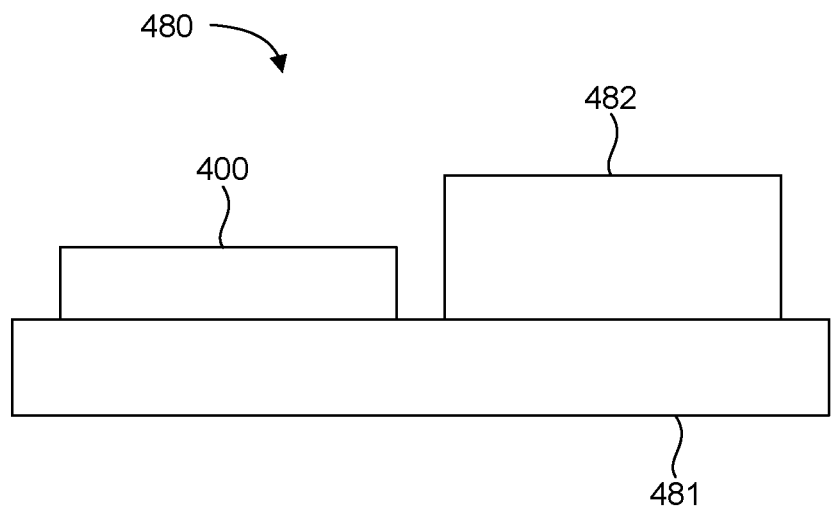
FIG. 6 is a schematic illustration of an exemplary memory device.

FIG. 6 is a schematic representation of a memory device 480 in accordance with an example of the present disclosure. The memory device can include a substrate 481 and a memory component 400 as disclosed herein operably coupled to the substrate 481. In one aspect, the memory device 480 can include any suitable electronic component 482, such as a CPU, a GPU, a memory controller, a video decoder, an audio decoder, a video encoder, a camera processor, system memory, and/or a modem.

Figure 7:
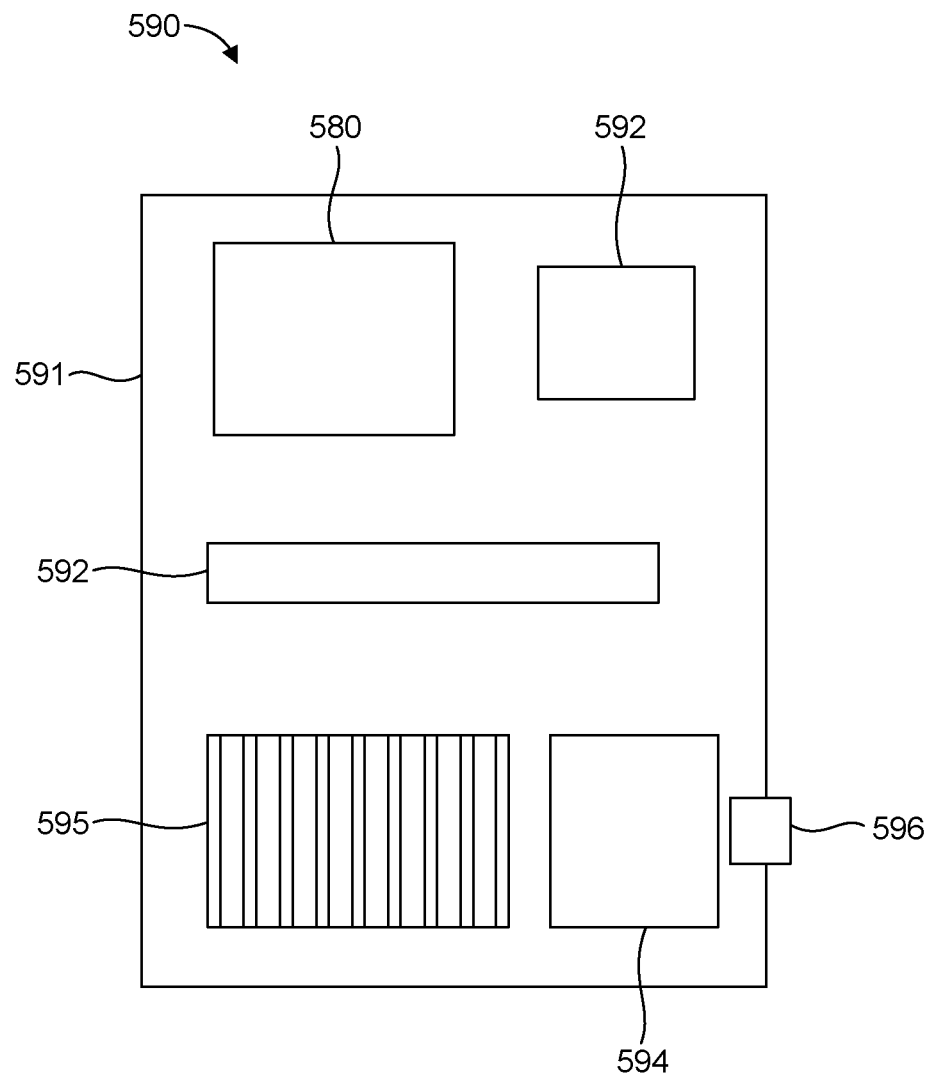
FIG. 7 is a schematic illustration of an exemplary computing system.

FIG. 7 illustrates an example computing system 590. The computing system 590 can include a memory device 580 as disclosed herein, coupled to a motherboard 591. In one aspect, the computing system 590 can also include a processor 592, a memory device 593, a radio 594, a heat sink 595, a port 596, a slot, or any other suitable device or component, which can be operably coupled to the motherboard 591. The computing system 590 can comprise any type of computing system, such as a desktop computer, a laptop computer, a tablet computer, a smartphone, a wearable device, a server, etc. Other embodiments need not include all of the features specified in FIG. 7, and may include alternative features not specified in FIG. 7.

Circuitry used in electronic components or devices (e.g. a die) of a memory device can include hardware, firmware, program code, executable code, computer instructions, and/or software. Electronic components and devices can include a non-transitory computer readable storage medium which can be a computer readable storage medium that does not include signal. In the case of program code execution on programmable computers, the computing devices recited herein may include a processor, a storage medium readable by the processor (including volatile and non-volatile memory and/or storage elements), at least one input device, and at least one output device. Volatile and non-volatile memory and/or storage elements may be a RAM, EPROM, flash drive, optical drive, magnetic hard drive, solid state drive, or other medium for storing electronic data. Node and wireless devices may also include a transceiver module, a counter module, a processing module, and/or a clock module or timer module. One or more programs that may implement or utilize any techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

Examples

The following examples pertain to further embodiments.

In one example, there is provided a memory component comprising a source line, a conductive channel having first and second conductive layers electrically coupled to the source line, and memory cells adjacent to the conductive channel.

In one example of a memory component, the first conductive layer is spaced apart from the source line.

In one example of a memory component, a portion of the second conductive layer is disposed between and interfaces with the source line and the first conductive layer.

In one example of a memory component, an interface of the second conductive layer and the source line is substantially free of an oxide material.

In one example of a memory component, an interface of the second conductive layer and the source line is planar.

In one example of a memory component, the interface of the second conductive layer and the source line has a diameter greater than or equal to 25 nm.

In one example of a memory component, portions of the second conductive layer surround a portion of the first conductive layer.

In one example of a memory component, the first and second conductive layers each comprise a doped polysilicon material.

In one example of a memory component, the doped polysilicon materials of the first and second conductive layers are different.

In one example of a memory component, the first conductive layer is P-type or N-type doped, and the second conductive layer is the other of P-type or N-type doped.

In one example of a memory component, at least one of the first and second conductive layers comprises Ge, SiGe, or a combination thereof.

In one example of a memory component, the source line comprises a doped polysilicon material.

In one example of a memory component, the conductive channel is vertically oriented.

In one example, a memory component comprises an insulative material disposed within the conductive channel.

In one example, a memory component comprises a dielectric layer adjacent to the conductive channel.

In one example of a memory component, the dielectric layer forms a tunnel dielectric.

In one example of a memory component, each memory cell comprises a charge storage structure.

In one example of a memory component, the charge storage structure comprises a floating gate.

In one example of a memory component, the charge storage structure comprises a charge trap.

In one example of a memory component, each memory cell comprises a control gate.

In one example of a memory component, each memory cell comprises a tunnel dielectric adjacent to the conductive channel, a charge storage structure adjacent to the tunnel dielectric, a control gate, and a blocking dielectric between the charge storage structure and the control gate.

In one example, a memory component comprises a source select gate adjacent to the conductive channel.

In one example of a memory component, the memory component is a flash memory component.

In one example of a memory component, the flash memory component is a NAND memory component or a NOR memory component.

In one example, there is provided a memory device comprising a substrate, and a memory component operably coupled to the substrate, the memory component having a source line, and a conductive channel having first and second conductive layers electrically coupled to the source line.

In one example of a memory device, the first conductive layer is spaced apart from the source line.

In one example of a memory device, a portion of the second conductive layer is disposed between and interfaces with the source line and the first conductive layer.

In one example of a memory device, an interface of the second conductive layer and the source line is planar.

In one example of a memory device, the interface of the second conductive layer and the source line has a diameter greater than or equal to 25 nm.

In one example of a memory device, portions of the second conductive layer surround a portion of the first conductive layer.

In one example of a memory device, the first and second conductive layers each comprise a doped polysilicon material.

In one example of a memory device, the doped polysilicon materials of the first and second conductive layers are different.

In one example of a memory device, the first conductive layer is P-type or N-type doped, and the second conductive layer is the other of P-type or N-type doped.

In one example of a memory device, at least one of the first and second conductive layers comprises Ge, SiGe, or a combination thereof.

In one example of a memory device, the source line comprises a doped polysilicon material.

In one example of a memory device, the conductive channel is vertically oriented.

In one example, a memory device comprises an insulative material disposed within the conductive channel.

In one example, a memory device comprises a dielectric layer adjacent to the conductive channel.

In one example of a memory device, the dielectric layer forms a tunnel dielectric.

In one example, a memory device comprises memory cells adjacent to the conductive channel.

In one example of a memory device, each memory cell comprises a charge storage structure.

In one example of a memory device, the charge storage structure comprises a floating gate.

In one example of a memory device, each memory cell comprises a control gate.

In one example of a memory device, each memory cell comprises a tunnel dielectric adjacent to the conductive channel, a charge storage structure adjacent to the tunnel dielectric, a control gate, and a blocking dielectric between the charge storage structure and the control gate.

In one example, a memory device comprises a source select gate adjacent to the conductive channel.

In one example, a memory device comprises a CPU, a GPU, a memory controller, a video decoder, an audio decoder, a video encoder, a camera processor, system memory, a modem, or a combination thereof.

In one example, there is provided a computing system comprising a motherboard, and a memory device operably coupled to the motherboard. The memory device comprises a substrate, and a memory component operably coupled to the substrate, the memory component having a source line, and a conductive channel having first and second conductive layers electrically coupled to the source line.

In one example of a computing system, the computing system comprises a desktop computer, a laptop, a tablet, a smartphone, a wearable device, a server, or a combination thereof.

In one example of a computing system, the computing system comprises a processor, a memory device, a heat sink, a radio, a slot, a port, or a combination thereof operably coupled to the motherboard.

In one example, there is provided a method for making a memory component comprising forming a first conductive layer on a dielectric layer, the dielectric layer having a bottom portion proximate a source line, exposing the source line through an opening in the bottom portion of the dielectric layer, and forming a second conductive layer on the first conductive layer and on the exposed portion of the source line such that the first and second conductive layers are electrically coupled to the source line.

In one example of a method for making a memory component, exposing the source line comprises forming an opening through a bottom portion of the first conductive layer, and removing the bottom portion of the dielectric layer proximate the opening.

In one example of a method for making a memory component, forming the opening through the bottom portion of the first conductive layer comprises etching through the bottom portion of the first conductive layer.

In one example of a method for making a memory component, etching comprises dry etching.

In one example, a method for making a memory component comprises protecting an upper portion of the first conductive layer from etching.

In one example of a method for making a memory component, protecting an upper portion of the first conductive layer comprises forming a sacrificial layer on the first conductive layer.

In one example of a method for making a memory component, exposing the source line further comprises forming an opening through a bottom portion of the sacrificial layer to expose the bottom portion of the dielectric layer.

In one example, a method for making a memory component comprises removing the sacrificial layer prior to forming the second conductive layer on the first conductive layer.

In one example of a method for making a memory component, the sacrificial layer comprises an oxide material.

In one example of a method for making a memory component, removing the bottom portion of the dielectric layer proximate the opening comprises etching the bottom portion of the dielectric layer.

In one example of a method for making a memory component, etching comprises wet etching.

In one example of a method for making a memory component, wet etching comprises hydrofluoric acid etching.

In one example of a method for making a memory component, removing the bottom portion of the dielectric layer proximate the opening comprises forming a recess between the first conductive layer and the source line, and forming the second conductive layer on the first conductive layer such that the first and second conductive layers are electrically coupled to the source line comprises forming the second conductive layer in the recess such that the second conductive layer interfaces with the source line and the first conductive layer.

In one example of a method for making a memory component, forming the first conductive layer on the dielectric layer comprises depositing a first conductive material on the dielectric layer.

In one example of a method for making a memory component, forming the second conductive layer on the first conductive layer comprises depositing a second conductive material on the first conductive layer.

In one example of a method for making a memory component, an exposed portion of the source line has a planar surface.

In one example of a method for making a memory component, an exposed portion of the source line has a diameter greater than or equal to 25 nm.

In one example of a method for making a memory component, the first and second conductive layers each comprise a doped polysilicon material.

In one example of a method for making a memory component, the doped polysilicon materials of the first and second conductive layers are different.

In one example of a method for making a memory component, the first conductive layer is P-type or N-type doped, and the second conductive layer is the other of P-type or N-type doped.

In one example of a method for making a memory component, at least one of the first and second conductive layers comprises Ge, SiGe, or a combination thereof.

In one example of a method for making a memory component, the source line comprises a doped polysilicon material.

In one example of a method for making a memory component, the first and second conductive layers form a conductive channel.

In one example of a method for making a memory component, the conductive channel is vertically oriented.

In one example, a method for making a memory component comprises disposing an insulative material within the conductive channel.

In one example, a method for making a memory component comprises forming memory cells adjacent to the conductive channel.

In one example of a method for making a memory component, forming memory cells comprises forming charge storage structures.

In one example of a method for making a memory component, the charge storage structures are floating gates.

In one example of a method for making a memory component, forming memory cells comprises forming control gates.

In one example of a method for making a memory component, the dielectric layer forms a tunnel dielectric.

In one example of a method for making a memory component, forming memory cells comprises forming control gates, forming blocking dielectrics proximate the control gates, and forming charge storage structures proximate the blocking dielectrics, wherein the charge storage structures are adjacent the tunnel dielectric.

In one example, a method for making a memory component comprises forming a source select gate adjacent to the conductive channel.

In one example, there is provided a conductive channel, comprising a plurality of doped conductive material layers.

In one example of a conductive channel, each of the plurality of doped conductive material layers comprises a doped polysilicon material.

In one example of a conductive channel, the doped polysilicon materials of at least two of the plurality of doped conductive material layers are different.

In one example of a conductive channel, one doped conductive material layer is P-type or N-type doped, and another doped conductive material layer is the other of P-type or N-type doped.

In one example of a conductive channel, at least one of the plurality of doped conductive material layers comprises Ge, SiGe, or a combination thereof.

In one example, there is provided a method of forming a conductive channel to electrically connect a string of memory cells to a source line, the method comprising obtaining a first doped conductive material layer, and forming a second doped conductive material layer on the first doped conductive material layer.

In one example of a method of forming a conductive channel, forming the second doped conductive material layer on the first doped conductive material layer comprises depositing the second doped conductive material layer on the first doped conductive material layer.

In one example of a method of forming a conductive channel, the first and second doped conductive material layers each comprises a doped polysilicon material.

In one example of a method of forming a conductive channel, the doped polysilicon materials of the first and second doped conductive material layers are different.

In one example of a method of forming a conductive channel, the first doped conductive material layer is P-type or N-type doped, and the second doped conductive material layer is the other of P-type or N-type doped.

In one example of a method of forming a conductive channel, at least one of the first and second doped conductive material layers comprises Ge, SiGe, or a combination thereof.

While the forgoing examples are illustrative of the specific embodiments in one or more particular applications, it will be apparent to those of ordinary skill in the art that numerous modifications in form, usage and details of implementation can be made without departing from the principles and concepts articulated herein.

What is claimed is:

1. A memory component, comprising:
   a source line;
   a conductive channel having first and second conductive layers electrically coupled to the source line, said first and second conductive layers directly interfacing one another along at least a portion thereof, and wherein a portion of the conductive channel is in direct contact with the source line; and
   memory cells adjacent to the conductive channel.

2. The memory component of claim 1, wherein the first conductive layer is spaced apart from the source line.

3. The memory component of claim 2, wherein a portion of the second conductive layer is disposed between and interfaces with the source line and the first conductive layer.

4. The memory component of claim 3, wherein an interface of the second conductive layer and the source line is substantially free of an oxide material.

5. The memory component of claim 3, wherein an interface of the second conductive layer and the source line is planar.

6. The memory component of claim 5, wherein the interface of the second conductive layer and the source line has a diameter greater than or equal to 25 nm.

7. The memory component of claim 2, wherein portions of the second conductive layer surround a portion of the first conductive layer.

8. The memory component of claim 1, wherein the first and second conductive layers each comprise a doped polysilicon material.

9. The memory component of claim 8, wherein the doped polysilicon materials of the first and second conductive layers are different.

10. The memory component of claim 9, wherein the first conductive layer is P-type or N-type doped, and the second conductive layer is the other of P-type or N-type doped.

11. The memory component of claim 1, further comprising an insulative material disposed within the conductive channel.

12. The memory component of claim 1, further comprising a dielectric layer adjacent to the conductive channel.

13. The memory component of claim 12, wherein the dielectric layer forms a tunnel dielectric.

14. The memory component of claim 1, wherein each memory cell comprises:
   a tunnel dielectric adjacent to the conductive channel;
   a charge storage structure adjacent to the tunnel dielectric;
   a control gate; and
   a blocking dielectric between the charge storage structure and the control gate.

15. The memory component of claim 1, further comprising a source select gate adjacent to the conductive channel.

16. A memory device, comprising:
   a substrate; and
   a memory component as recited in claim 1 operably coupled to the substrate.

17. The memory device of claim 16, wherein each memory cell comprises:
   a tunnel dielectric adjacent to the conductive channel;
   a charge storage structure adjacent to the tunnel dielectric;
   a control gate; and
   a blocking dielectric between the charge storage structure and the control gate.

18. The memory device of claim 16, further comprising a source select gate adjacent to the conductive channel.

* * * * *